(12) United States Patent
Chuang et al.

(10) Patent No.: US 7,858,961 B2
(45) Date of Patent: Dec. 28, 2010

(54) PHASE CHANGE MEMORY DEVICES AND METHODS FOR FABRICATING THE SAME

(75) Inventors: Jen-Chi Chuang, Hsinchu County (TW); Yung-Fa Lin, Hsinchu (TW); Ming-Jeng Huang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/325,067

(22) Filed: Nov. 28, 2008

(65) Prior Publication Data

US 2009/0294750 A1 Dec. 3, 2009

(30) Foreign Application Priority Data

Jun. 3, 2008 (TW) .............................. 97120577 A

(51) Int. Cl.
*H01L 47/00* (2006.01)
(52) U.S. Cl. .................. 257/4; 257/E47.001; 365/148; 438/102
(58) Field of Classification Search .................... 257/4, 257/E45.002, E45.003, E47.001; 438/102; 365/148
See application file for complete search history.

(56) References Cited

U.S. PATENT DOCUMENTS

| | | | | |
|---|---|---|---|---|
| 6,501,111 B1* | 12/2002 | Lowrey | ...................... | 257/295 |
| 6,927,410 B2* | 8/2005 | Chen | .............................. | 257/2 |
| 7,002,195 B2* | 2/2006 | Park | ........................... | 257/295 |
| 7,064,344 B2* | 6/2006 | Xu | ................................. | 257/5 |
| 7,135,696 B2* | 11/2006 | Karpov et al. | .................. | 257/2 |
| 7,655,941 B2* | 2/2010 | Lin et al. | ........................ | 257/4 |
| 2003/0219924 A1* | 11/2003 | Bez et al. | ..................... | 438/102 |
| 2005/0064606 A1* | 3/2005 | Pellizzer et al. | ................. | 438/3 |
| 2005/0093022 A1* | 5/2005 | Lung | .......................... | 257/200 |
| 2005/0191804 A1* | 9/2005 | Lai et al. | ..................... | 438/238 |
| 2006/0284237 A1 | 12/2006 | Park et al. | | |
| 2007/0152205 A1* | 7/2007 | Chen | ............................. | 257/4 |
| 2008/0164454 A1* | 7/2008 | Chen | ............................. | 257/4 |
| 2009/0081825 A1* | 3/2009 | Chen | .......................... | 438/102 |
| 2009/0127535 A1* | 5/2009 | Chen et al. | ...................... | 257/2 |

FOREIGN PATENT DOCUMENTS

| | | | |
|---|---|---|---|
| CN | 1808706 A | | 7/2006 |
| CN | 1992326 A | | 7/2007 |
| CN | 101232074 | * | 7/2008 |
| CN | 101355137 | * | 1/2009 |

* cited by examiner

*Primary Examiner*—Mary Wilczewski
*Assistant Examiner*—Toniae M Thomas

(57) ABSTRACT

An exemplary phase change memory device is provided, including a substrate with a first electrode formed thereover. A first dielectric layer is formed over the first electrode and the substrate. A plurality of cup-shaped heating electrodes is respectively disposed in a portion of the first dielectric layer. A first insulating layer is formed over the first dielectric layer, partially covering the cup-shaped heating electrodes and the first dielectric layer therebetween. A second insulating layer is formed over the first dielectric layer, partially covering the cup-shaped heating electrodes and the first dielectric layer therebetween. A pair of phase change material layers is respectively disposed on opposing sidewalls of the second insulating layer and contacting with one of the cup-shaped heating electrodes. A pair of first conductive layers is formed on the second insulating layer along the second direction, respectively.

8 Claims, 13 Drawing Sheets

PHASE CHANGE MEMORY DEVICES AND METHODS FOR FABRICATING THE SAME

CROSS REFERENCE TO RELATED APPLICATIONS

This application claims priority of Taiwan Patent Application No. 97120577, filed on Jun. 3, 2008, the entirety of which is incorporated by reference herein.

BACKGROUND OF THE INVENTION

1. Field of the Invention

The invention relates to memory devices, and more particularly to a phase change memory (PCM) device and a method for fabricating the same.

2. Description of the Related Art

Phase change memory devices are non-volatile, highly readable, and highly programmable, and require a relatively lower driving voltage/current. Current trends in phase change memory development are to increase cell density and reduce working currents such as write currents and reset currents thereof.

Phase change material in a phase change memory device has at least two solid phases, a crystalline state and an amorphous state. Transformation between the two phases can be achieved by changing the temperature of the phase change material. The phase change material exhibits different electrical characteristics depending on its state. For example, in its amorphous state the material exhibits a higher resistivity than in the crystalline state. Such phase change material may switch between numerous electrically detectable conditions of varying resistivities within a nanosecond time scale with the input of pico joules of energy. Since phase change material permits reversible phase transformation, memory bit status can be distinguished by determining the phase of phase change material in the memory bit.

FIG. 1 is a schematic diagram showing a cross sectional view of a conventional phase change memory cell structure. As shown in FIG. 1, the phase change memory cell structure includes a silicon substrate 10 with a bottom electrode 12 made of conductive material such as Al or W thereon. A dielectric layer 14 is formed over the bottom electrode 12 and a heating electrode 16 is formed in a portion of the dielectric layer 14. Moreover, a patterned phase change material layer 20 is stacked over the dielectric layer 14. The patterned phase change material layer 20 is formed within a dielectric layer 18 which is formed over the dielectric layer 14 and a bottom surface of the phase change material layer 20, partially contacting the heating electrode 16. A dielectric layer 24 is formed over the dielectric layer 18 and a top electrode 22 is formed over and in the dielectric layer 24. The top electrode 22 partially covers the dielectric layer 24 and portions thereof protrude downward through the dielectric layer 24, thereby contacting the phase change material layer 20 thereunder.

During memory cell operation, a large current is generated by the heating electrode 16 and flows therethrough, thus heating up an interface between the phase change material layer pattern 20 and the heating electrode 16 and thereby transforming a portion (not shown) of the phase change material layer 20 into either the amorphous state or the crystalline state depending on the length of time and amount of current that flows through the heating electrode 16.

Currently, to enhance applications of phase change memory devices, size of the memory cells of the phase change memory devices is being required to be further reduced. With size reduction of the memory cell, however, it also means working current of the memory cells should also be reduced while increasing memory cell density.

One problem found with conventional phase change memory cell structure as shown in FIG. 1, is that the amount of write current and reset current required to successfully change the phase state of the phase change material during cell operation is relatively large. One solution to reduce write current and reset current and to successfully turn on the phase change reaction of the memory cells, is to reduce the contact surface between the heating electrode 16 and the phase change material layer 20, such as by reducing a diameter Do of the heating electrode 16, thereby maintaining or increasing a current density at the interface.

Reduction of the diameter $D_0$ of the heating electrode 16, however, is limited by current photolithography process ability, thereby limiting size reduction of the heating electrode 16 and ability to decrease working currents such as write current and reset current.

BRIEF SUMMARY OF THE INVENTION

Phase change memory devices and methods for manufacturing the same are provided to thereby solve the aforementioned challenges and improve conventional phase change memory devices.

An exemplary embodiment of a phase change memory device comprises a substrate with a first electrode formed thereover. A first dielectric layer is formed over the first electrode and the substrate. A plurality of cup-shaped heating electrodes is respectively disposed in a portion of the first dielectric layer. A first insulating layer is formed over the first dielectric layer along a first direction, partially covering the cup-shaped heating electrodes and the first dielectric layer therebetween. A second insulating layer is formed over the first dielectric layer along a second direction, partially covering the cup-shaped heating electrodes and the first dielectric layer therebetween. A pair of phase change material layers is respectively disposed on opposing sidewalls of the second insulating layer and contacting with one of the cup-shaped heating electrodes. A pair of first conductive layers is formed on the second insulating layer along the second direction, respectively, wherein one of the first conductive layers contact with one of the phase change material layers.

An exemplary embodiment of a method for manufacturing a phase change memory device comprises providing a substrate with a first dielectric layer thereon. A pair of cup-shaped heating electrodes is formed in the first dielectric layer. A first insulating layer is formed over the first dielectric layer along a first direction, partially covering the cup-shaped heating electrodes and the first dielectric layer therebetween. A second insulating layer is formed over the cup-shaped heating electrodes, the first insulating layer, and the first dielectric layer along a second direction. A phase change material layer is formed on opposing sidewalls of the second insulating layer along the second direction, wherein the phase change material layer contacts one of the cup-shaped heating electrodes. A third insulating layer is blanketly formed over the second insulating layer, the phase change material layers, the cup-shaped heating electrodes, and the first dielectric layer. A plurality of parallel trenches is formed in the third insulating layer along the second direction, wherein the trenches respectively expose one of the phase change material layers. A first conductive layer is formed in the trenches, wherein a bottom surface of the first conductive layer contacts one of the phase change material layers.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2a-2d are schematic diagrams showing various fabrication steps of a phase change memory device according to an embodiment of the invention, wherein FIG. 2a shows a schematic top view, and FIGS. 2b-2d show schematic cross sections taken along lines A~A', B~B' and C~C' of FIG. 2a, respectively;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
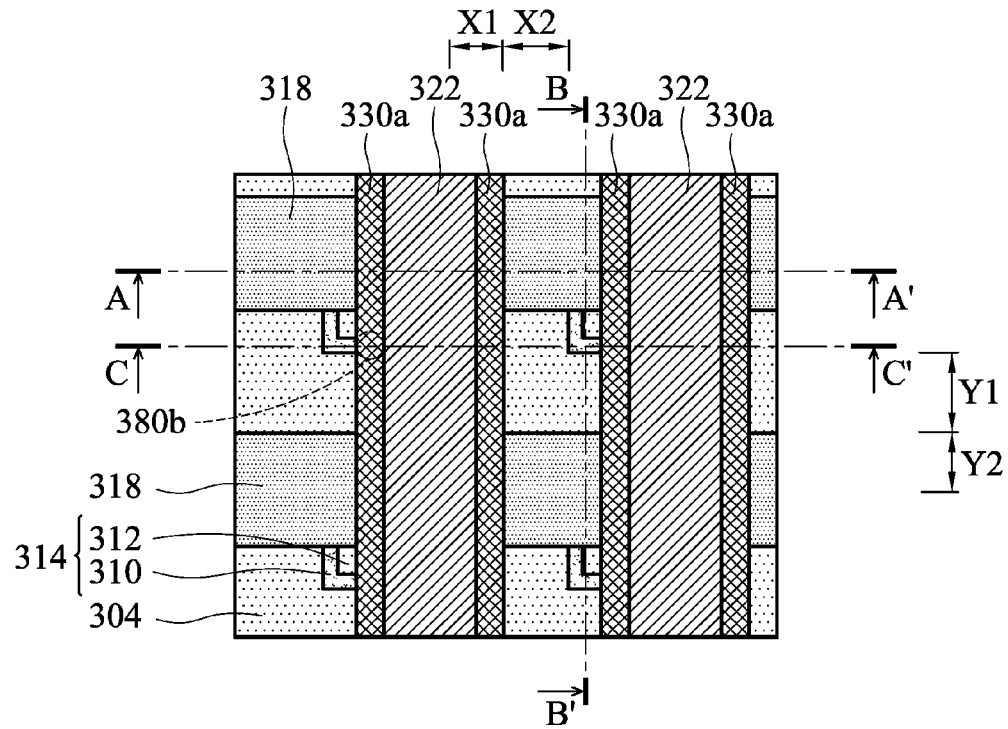
Figure 2B:
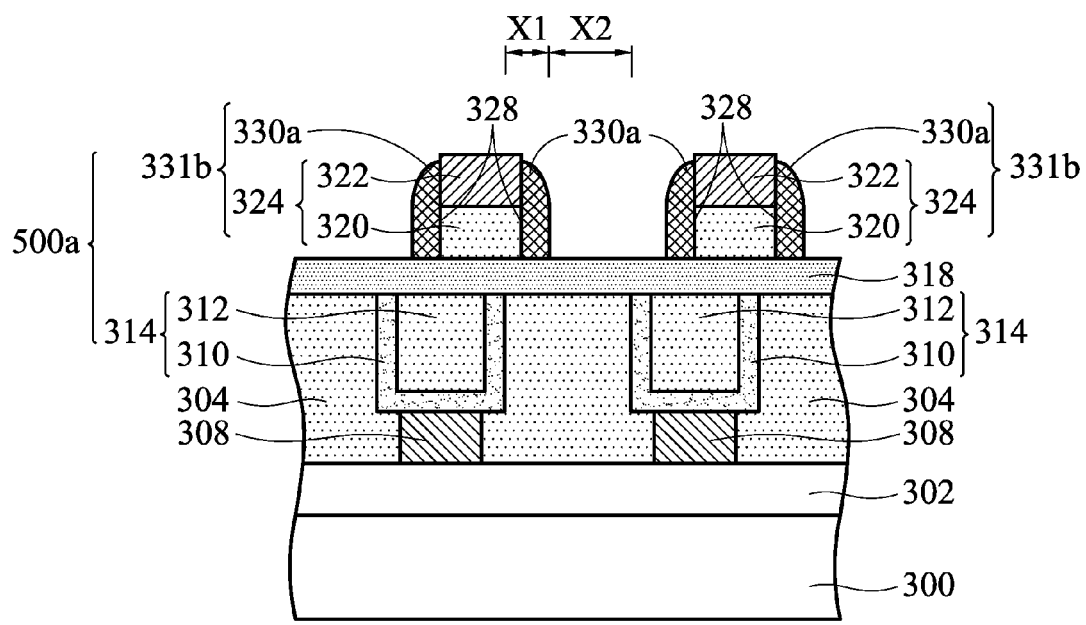
Figure 2C:
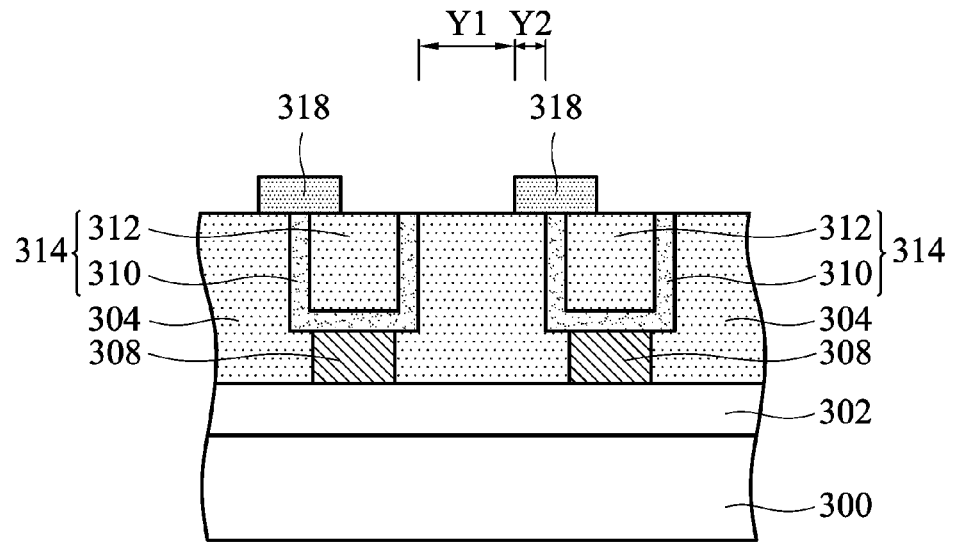
Figure 2D:
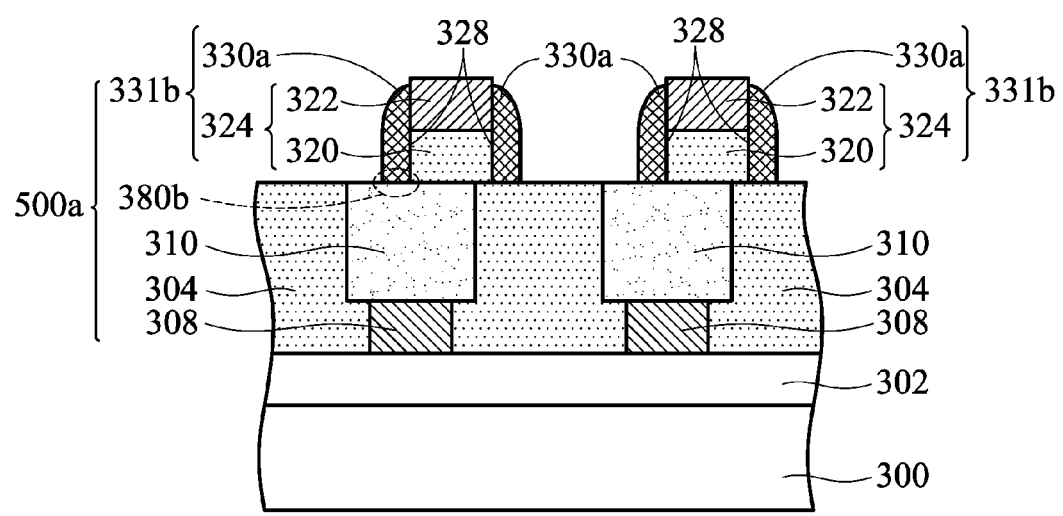

FIGS. 2a~2d are schematic diagrams showing various fabrication steps of a phase change memory (PCM) device according to an embodiment of the invention, wherein FIG. 2a shows a schematic top view, and FIGS. 2b-2d show schematic cross sections taken along lines A~A', B~B' and C~C' in FIG. 2a, respectively.

Herein, the PCM device illustrated in FIGS. 2a~2d and fabrication thereof are disclosed in a pending Taiwan patent application (Application No. 96100903, filed on Jan. 10, 2007,) which also belong to the same applicants of the present application and the entirety of which is incorporated by reference herein. Through the illustrations of the PCM device illustrated in FIGS. 2a-2d, problems found by the inventors of the pending application are discussed as below.

As shown in FIGS. 2a~2d, an exemplary PCM device including a plurality of memory cells is disclosed. Each cell of the phase change memory device substantially includes a substrate 300 with a first electrode layer 302 formed thereon. A first phase change memory structure 500a is formed on the first electrode layer 302 and is electrically connected to the first electrode layer 302. The first phase change memory structure 500a includes a cup-shaped heating electrode 314 disposed in a first dielectric layer 304. A first insulating layer 318 is disposed on the first dielectric layer 304 and covers a portion of the cup-shaped heating electrode 314 which is formed by the conductive layer 310 and the third insulating layer 312. A first electrode structure 331b is disposed in the first insulating layer 318 and the cup-shaped heating electrode 314, wherein the first insulating layer 318 is perpendicular to the first electrode structure 331b. The first electrode structure includes a pair of phase change material spacers 330a disposed on a pair of sidewalls 328 of the first electrode structure 331b, covering a portion of the cup-shaped heating electrode 314.

Figure 1:
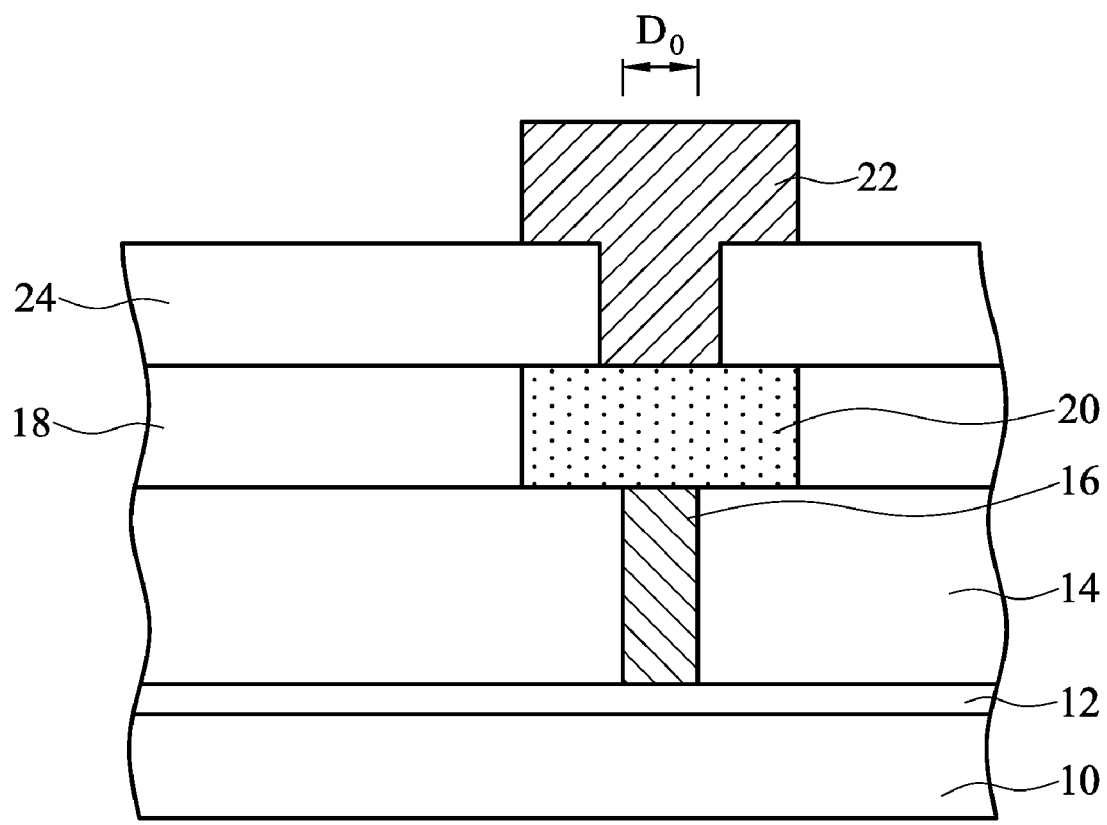
FIG. 1 is cross section of a conventional phase change memory device.

In this embodiment, an over-etching step is performed to remove a portion of the phase change material formed on sidewalls of the first insulating layer 318, thereby forming phase change material spacers 330a in sidewalls 328 of the stacked structure 324. Additionally, the height of the phase change material spacers 330a is lowered to a level lower than the height of the stacked structure 324, thus forming the first electrode structure 331b. The first electrode structure 331b mainly includes the silicon oxide layer 320, the conductive layer 322 and the phase change material spacers 330a, wherein the conductive layer 322 functions as a top electrode. A contact area 380b between the phase change material spacers 330a and the cup-shaped heating electrode 314b can thus be controlled by controlling film thicknesses of the phase change material spacers 330a and/or the conductive layer 310. Thus, a heating electrode with reduced surface area can be formed with more precise control than that formed by the conventional photolithography process, as illustrated in the conventional phase change memory device in FIG. 1. Specifically, by controlling the contact area 380b between the phase change material spacers 330a and the cup-shaped heating electrode 314, working currents such as write current and reset current can be further reduced.

However, since the conductive layer 322 functioning as the top electrode is disposed with a deviation and is not vertically stacked over and in align with the cup-shaped heating electrode 314 thereunder. a pitch X1 is needed to exist between the phase change material spacer 330a at one side of the conductive layer 322 not contacting the cup-shaped heating electrode 314 and a part of the cup-shaped heating electrode 314 disposed under the conductive layer 322 not contacting the phase change material spacer 330a. Additionally, a pitch X2 is needed to exist between another phase change material spacer 330a at the other side of the conductive layer 322 not contacting the cup-shaped heating electrode 314 and the phase change material spacer 330a contacting the cup-shaped heating electrode 314 in an adjacent cell (referring to FIGS. 2a and 2b). Thus, providing a process window for following device fabrication and preventing device shoring between adjacent memory cell units. The size of the pitches X1 and X2 are about, for example, 0.02 µm to 0.2 µm. Herein, the region and degree of seniority of the pitches X1 and X2 are not limited by those illustrated in FIGS. 2a and 2b. The region and degree of seniority of the pitches X1 and X2 may depend on the process used for fabricating the phase change memory devices and may be properly extended or reduced.

In addition, as shown in FIGS. 2a and 2c, a pitch Y1 is needed and exists between the cup-shaped heating electrode 314 and the insulating layer 318 covering an adjacent memory cell unit, and a pitch Y2 is needed and exists between the cup-shaped heating electrode 314 in the memory cell unit covered by the insulating layer 318 and the insulating layer 318, thereby assuring normal operation of the memory cell units and providing a process window for following device fabrication (e.g. first electrode structure 331b). The size of the pitches Y1 and Y2 are about, for example, 0.02 µm to 0.2 µm. Herein, the region and degree of seniority of the pitches Y1 and Y2 are not limited by those illustrated in FIGS. 2a and 2c. The region and degree of seniority of the pitches Y1 and Y2 may depend on the process used for fabricating the phase change memory devices and may be properly extended or reduced.

In this embodiment, because pitches X1, X2, Y1, and Y2 between phase change memory cells are needed, increasing cell density of the phase change memory device shown in FIGS. 2a~2d are limited.

Therefore, a novel phase change memory device and methods for fabricating the same are provided. The phase change memory device can be formed with reduced contact area between the heating electrode and the phase change material, reduced work currents such as write currents and/or reset currents, and increased memory cell density.

FIGS. 3~8 are schematic diagrams showing various fabrication steps of a phase change memory device according to another embodiment of the invention, wherein FIGS. 3a, 4a, 5a, 6a, 7a and 8a respectively show a schematic top view, FIGS. 3b, 4b, 5b, 6b, 7b and 8b respectively show a cross section taken along line A-A' of FIGS. 3a, 4a, 5a, 6a, 7a and 8a, and FIGS. 5c, 6c, 7c and 8c respectively show a cross section taken along line B-B' of FIGS. 4a, 6a, 7a and 8a.

In the embodiment, the schematic diagrams only partially illustrate fabrication of the plurality of phase change memory cells in a phase change memory device. Note that the phase change memory device in the embodiment further comprises other conductive components (e.g. interconnection plugs or interconnecting lines) for electrically connecting the phase change memory cell with an active device (e.g. transistor or diode) and a conductive line. The conductive components and the active devices, however, are not shown in the schematic diagrams, for simplicity.

Figure 3A:
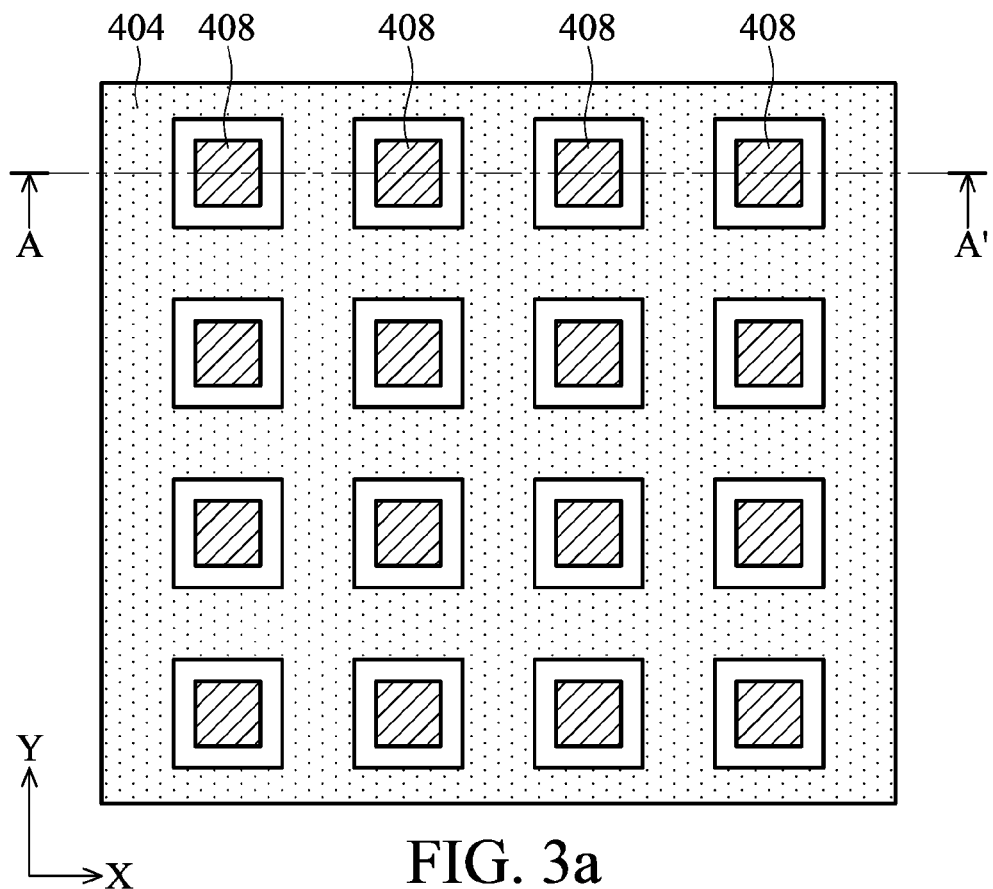
FIGS. 3a, 4a, 5a, 6a, 7a and 8a are schematic top views showing various fabrication steps of a phase change memory device according to another embodiment of the invention, respectively.
Figure 3B:
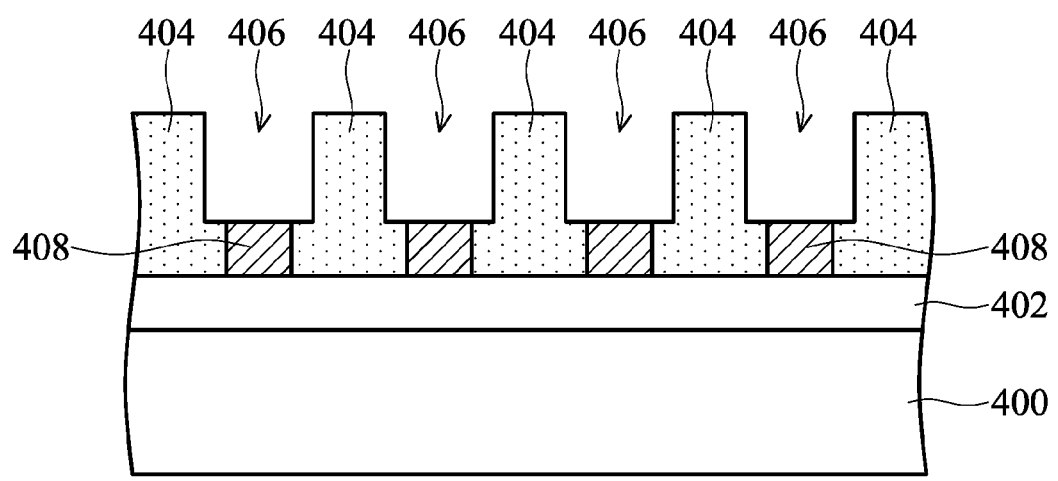
FIGS. 3b, 4b, 5b, 6b, 7b and 8b are schematic cross sections taken along line A~A' in FIGS. 3a, 4a, 5a, 6a, 7a and 8a, respectively.

FIGS. 3a and 3b are a schematic top view and a cross section showing another exemplary phase change memory device. A substrate 400 is first provided. The substrate 400 may comprise silicon. In alternative embodiments, SiGe, bulk semiconductor, strained semiconductor, compound semiconductor, silicon on insulator (SOI), and other commonly used semiconductor substrates can be used for the substrate 400. Next, an electrode layer 402, serving as a bottom electrode, is formed on the substrate 400 by a deposition process, such as, a physical vapor deposition (PVD), sputtering, low pressure chemical vapor deposition (LPCVD), atomic layer chemical vapor deposition (ALD) or electroless plating process. Herein, the first electrode layer 402 can be formed over the substrate 400 along an X direction illustrated in FIG. 3a (not shown). The electrode layer 402 may comprise polysilicon, amorphous silicon, metal nitride or metal silicide. The electrode layer 402 may also comprise metals or alloys. The electrode layer 402 may also comprise cobalt (Co), tantalum (Ta), nickel (Ni), titanium (Ti), tungsten (W), TiW, other refractory metals, composite metals or basic metals such as aluminum (Al) or copper (Cu). The electrode layer 402 may be a single layer or a composite layer, for example, Al layer, Cu/TaN layer or other single metal layers or composite metal layers.

Next, a p-type semiconductor layer and an n-type semiconductor layer (not shown) are formed on the electrode layer 402 by thin film deposition such as a CVD process. A portion of the p-type semiconductor layer and an n-type semiconductor are then removed to form a diode 408 by a photolithography and an etching process. The diode 408 may be a semiconductor composite layer, and preferably a stack of an n-type impurity doped semiconductor layer and a p-type impurity doped semiconductor layer to form a p-n junction. The n-type impurity may comprise phosphorous (P) or arsenic (As), and the p-type impurity may comprise boron (B) or difluoroborane ($BF_2$). Alternatively, the diode 408 may comprise polycrystalline semiconductor materials or amorphous semiconductor materials such as polysilicon or amorphous silicon.

Next, a dielectric layer 404 is formed on the electrode layer 402 and the diode 408 by thin film deposition such as a CVD process. The dielectric layer 404 may comprise silicon dioxide ($SiO_2$), silicon nitride ($SiN_X$) or the like. The dielectric layer 404 is then covered with a patterned photoresist to define the position of a plurality of cup-shaped openings 406, and a subsequent anisotropic etching process is performed to remove the first dielectric layer not covered by the patterned photoresist until each diode 408 is exposed. Next, the patterned photoresist is removed to form the cup-shaped openings 406. The bottom of each of the cup-shaped openings 406 is directly on top of one of the diodes 408 and is vertically aligned therewith. An aperture of the cup-shaped openings 406 is related to a thickness of subsequently formed phase change material spacers. In one embodiment, the aperture of the cup-shaped openings 406 is preferably about 0.02 μm~0.2 μm.

Figure 4A:
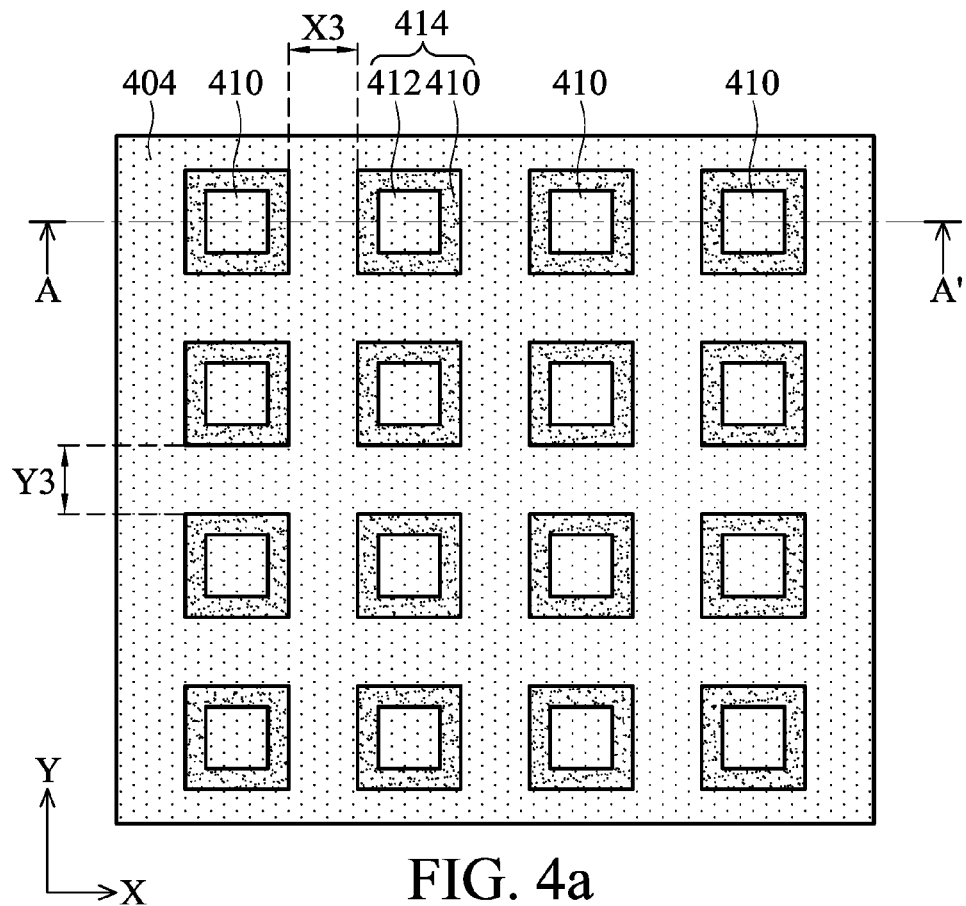
Figure 4B:
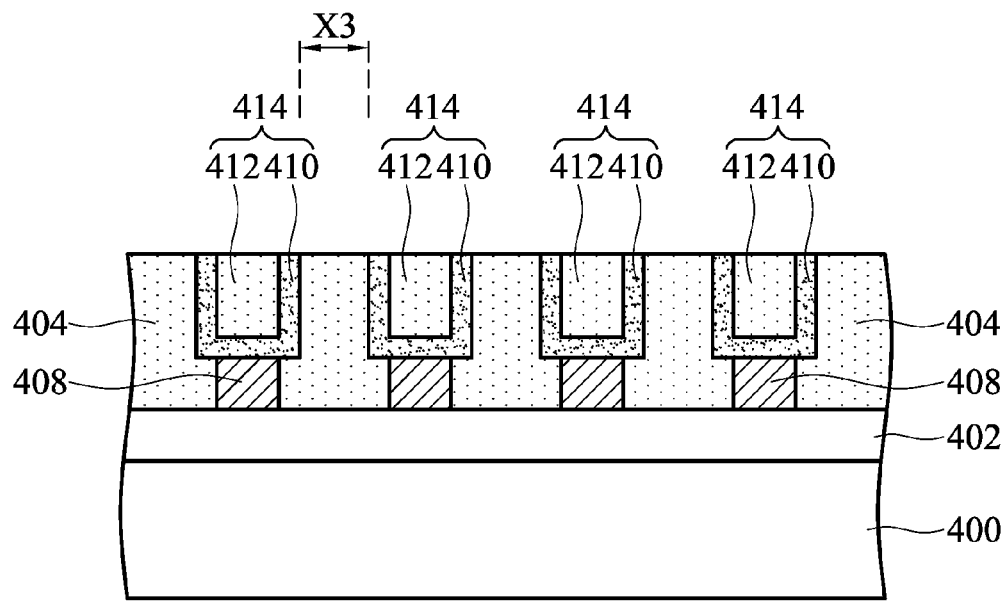

Referring to FIGS. 4a and 4b, a conductive layer 410 is formed on the dielectric layer 404 and sidewalls of the cup-shaped openings 406, covering the diodes 408 by a method such as a PVD, sputtering, LPCVD, ALD or electroless plating process. An insulating layer 412 is then formed on the conductive layer 410 and filled into the cup-shaped openings 406. A planarizing process such as a chemical mechanical polishing (CMP) process is performed to remove the excess conductive layer 410 and the insulating layer 412 to form a plurality of cup-shaped heating electrodes 414. The conductive layer 410 may comprise metals, alloys, metal compounds, semiconductor materials or combinations thereof. The conductive layer 410 may comprise basic metals or alloys thereof (such as Cu or Al), refractory metals or alloys thereof (such as Co, Ta, Ni, Ti, W or TiW), transition metal nitrides, refractory metal nitrides (such as CoN, TaN, NiN, TiN or WN), nitride metal silicides (such as $CoSi_xN_y$, $TaSi_xN_y$, $NiSi_xN_y$, $TiSi_xN_y$ or $WSi_xN_y$), metal silicides (such as Co-salicide ($CoSi_x$), Ta-salicide ($TaSi_x$), Ni-salicide ($NiSi_x$), Ti-salicide ($TiSi_x$), W-salicide ($WSi_x$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. The conductive layer 410 may have a thickness of about 2 nm to 20 nm. The cup-shaped heating electrodes 414 are electrically connected to the electrode layer 402 through the diodes 408. Herein, the cup-shaped heating electrodes 414 are arranged in an array and adjacent cup-shaped heating electrodes 414a illustrated in FIG. 4a are formed with pitches X3 and Y3 therebetween along the X and Y direction, respectively. The size of the pitches X3 and Y3 are about 0.02 μm~0.2 μm. Herein, the region and degree of seniority of the pitches X3 and Y3 are not limited by those illustrated in FIG. 4a. The region and degree of seniority of the pitches X3 and Y3 may depend on the process used for fabricating the phase change memory devices and may be properly extended or reduced.

Figure 5A:
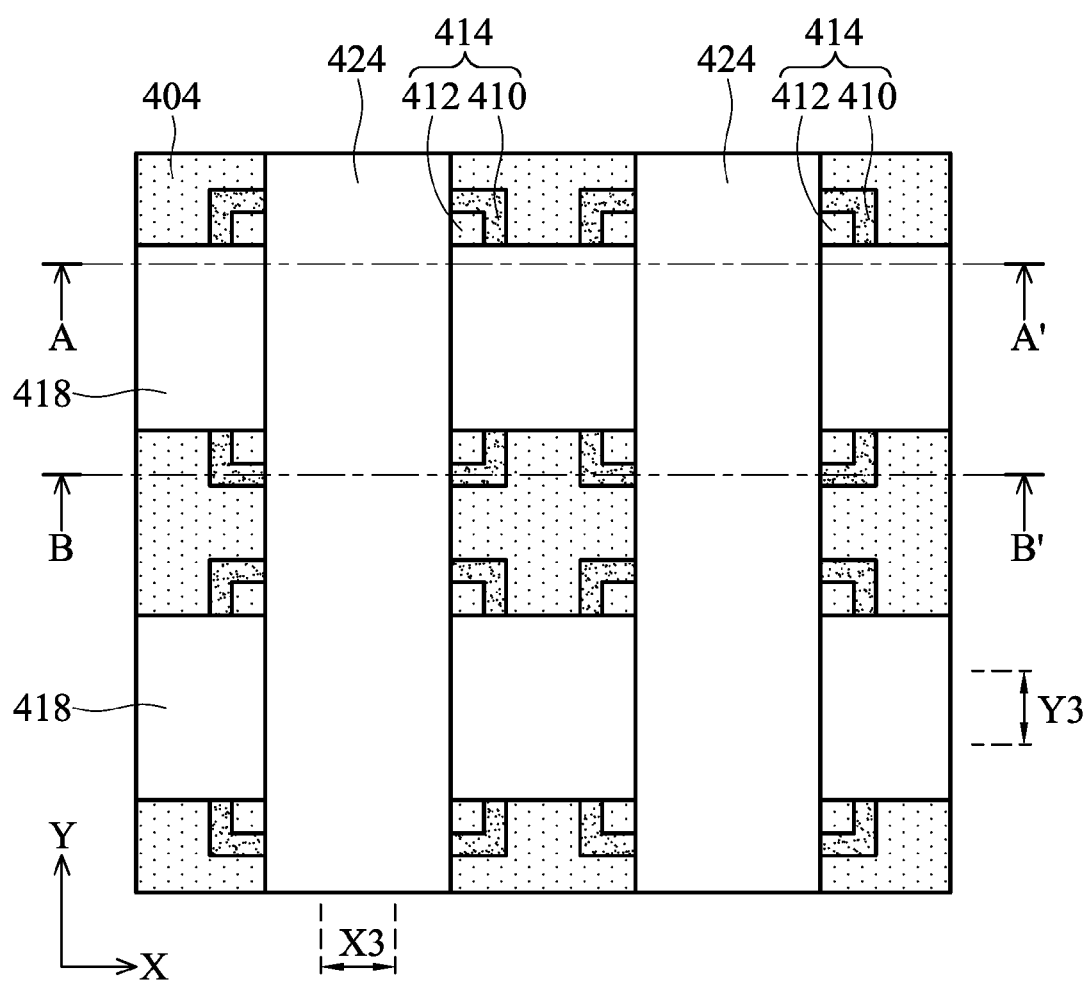
Figure 5B:
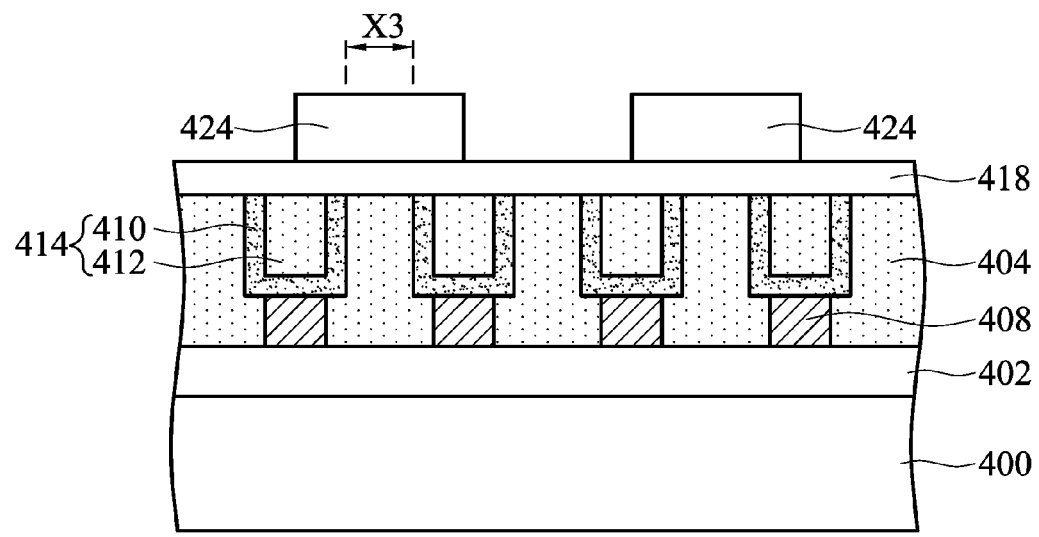
Figure 5C:
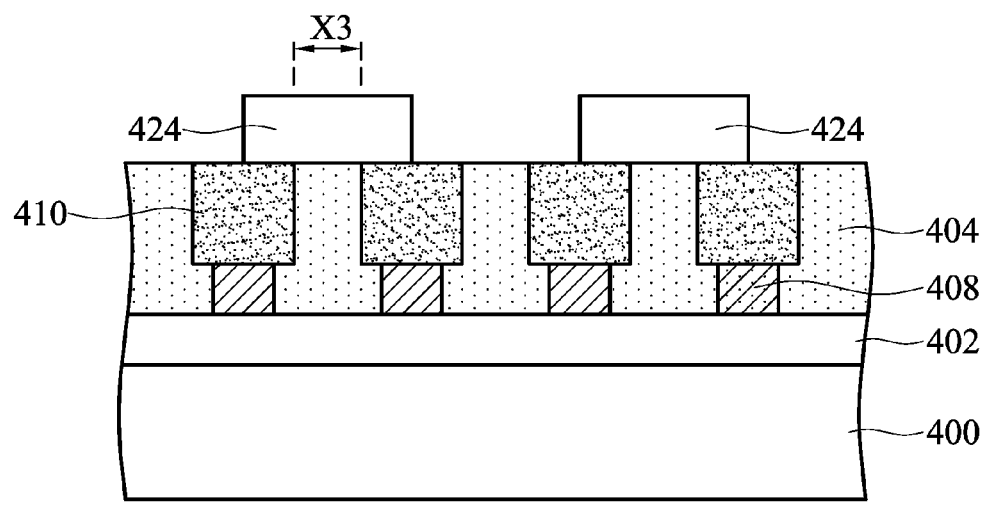
FIGS. 5c, 6c, 7c and 8c are schematic cross sections taken along line B~B' in FIGS. 5a, 6a, 7a and 8a, respectively.

FIGS. 5a, 5b and 5c illustrate formation of insulating layers 418 and insulating layers 424. An insulating material such as silicon nitride ($SiN_X$) is first blanketly formed on the dielectric layer 404 and the cup-shaped heating electrodes 414. Next, a patterned photoresist (not shown) is used to cover the insulating layer and to define the position of the first insulating layer 418. An anisotropic etching process is performed to remove the insulating material not covered by the patterned photoresist. The patterned photoresist is then removed to form the insulating layers 418 with strip-shapes. In one embodiment, the insulating layers 418 are formed over the substrate 404 in parallel along an X direction as illustrated in FIG. 5a, and preferably partially cover every two adjacent cup-shaped heating electrodes 414 and the dielectric layer 404 therebetween, such as covering half of the top surfaces of the cup-shaped heating electrodes 414 adjacent thereto. In one embodiment, the insulating layers 418 have a thickness of about 5 nm~20 nm.

Next, another insulating material such as silicon oxide (SiOx), silicon nitride ($SiN_X$), or combinations thereof is blanketly formed on the dielectric layer 404 and the insulating layers 418. Next, a patterned photoresist (not shown) is used to cover the conductive layer and define the position of the first insulating layer 424. An anisotropic etching process is performed to remove the insulating material not covered by the patterned photoresist. The patterned photoresist is then removed to form the insulating layers 424 with strip-shapes. In one embodiment, the insulating layers 424 are formed over the substrate 404 in parallel along a Y direction as illustrated in FIG. 5a, and preferably partially cover every two cup-shaped heating electrode 414 adjacent thereto and the insulating layer 418 therebetween. In this embodiment, the X direction is perpendicular to the Y direction in FIG. 5a and the insulating layers 424 are preferably extended along the Y direction and partially cover every two cup-shaped heating electrodes 414 adjacent thereto, such as covering half of the top surfaces of each of the cup-shaped heating electrodes 414. In this embodiment, the insulating layers 424 have a thickness of about 100 nm~200 nm.

Figure 6A:
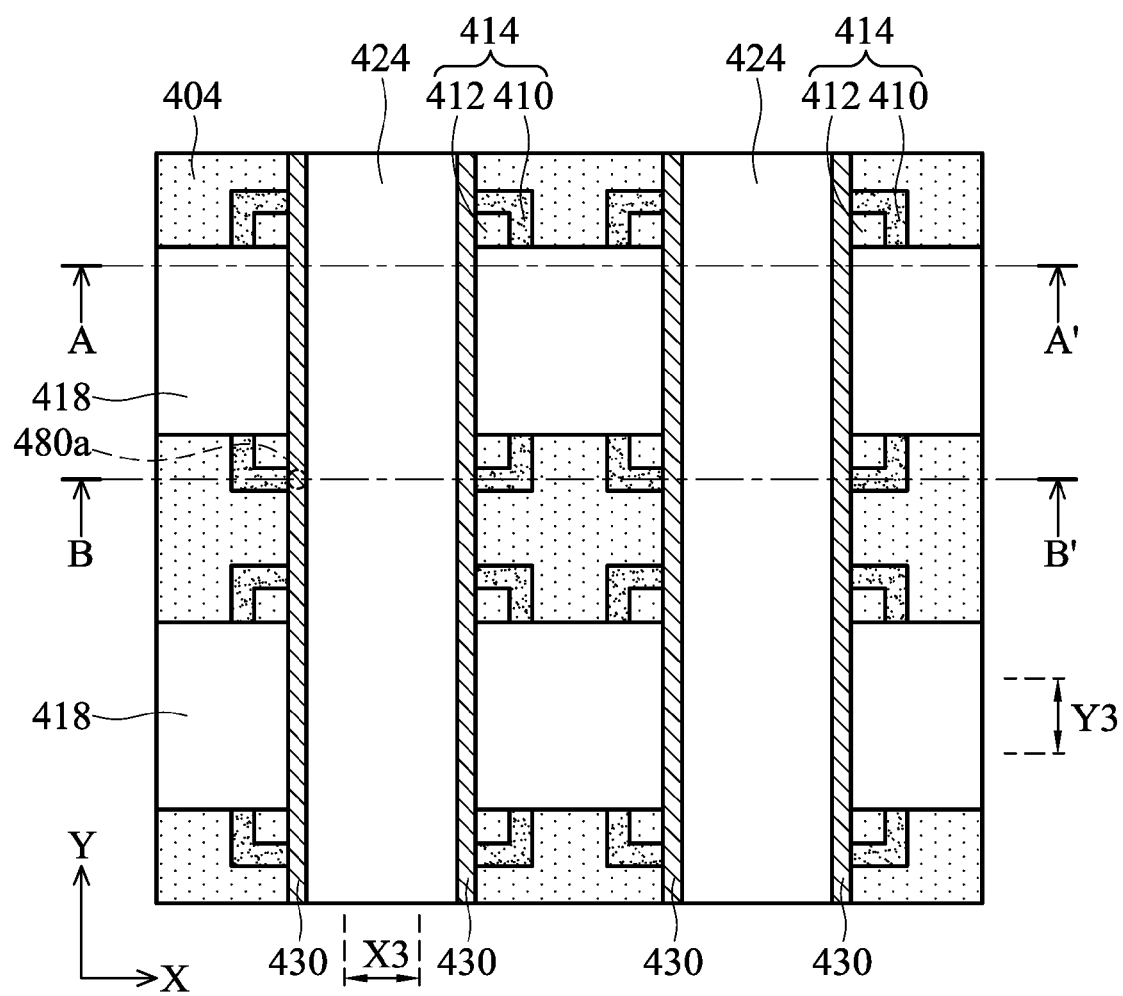
Figure 6B:
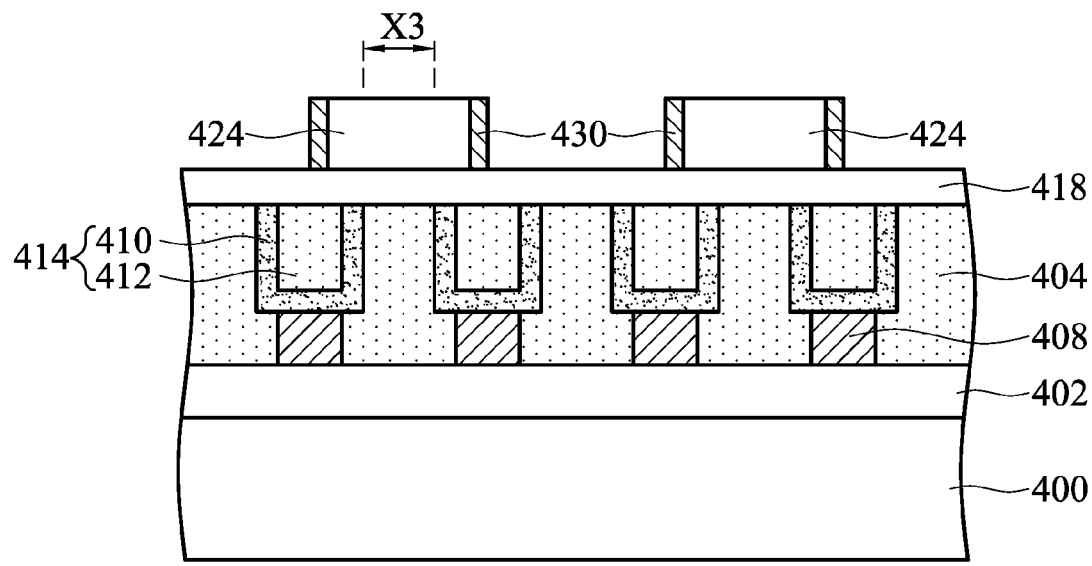
Figure 6C:
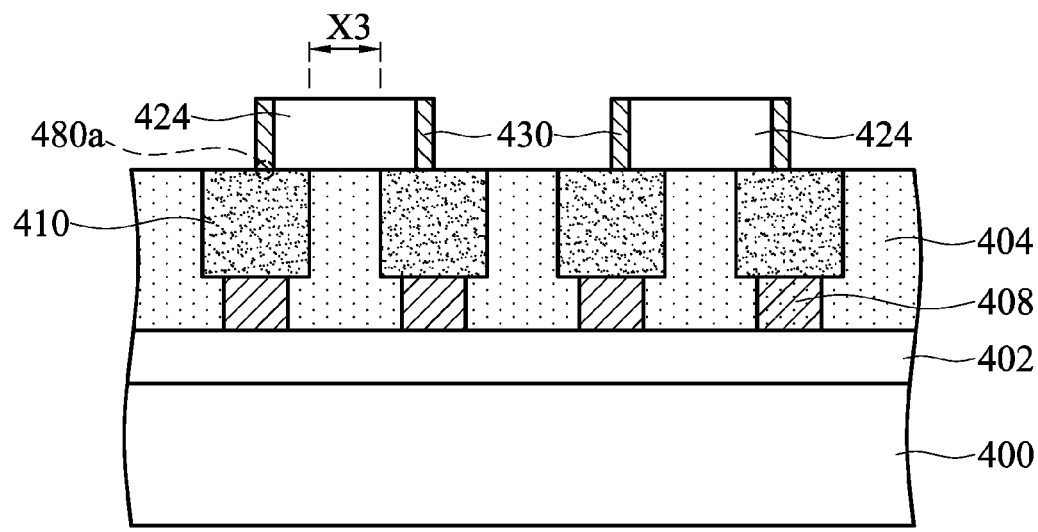

FIGS. 6a, 6b and 6c illustrate formation of phase change material layers 430. The phase change material layer 430 is formed by first blanketly depositing phase change materials over the entire region by a physical vapor deposition (PVD), thermal evaporation, pulsed laser deposition or metal organic chemical vapor deposition (MOCVD) process. Next, an anisotropic etching step is performed to form the phase change material layers 430 on sidewalls of each of the insulating layers 424.

The phase change material layer 430 may comprise binary, ternary or tetra chalcogenide such as GaSb, GeTe, Ge—Sb—Te (GST) alloy, Ag—In—Sb—Te alloy or combinations thereof. In some embodiments, the phase change material layers 430 preferably have a thickness of about 2 nm to 50 nm. An intersecting area between the phase change material layers 430 and the cup-shaped heating electrodes 414 controls a contact area 480a between the phase change material layers 430 and the conductive layer 410. Compared to the conventional process illustrated in FIG. 1, the size of the contact area 480a is smaller and can be more precisely controlled.

Figure 7A:
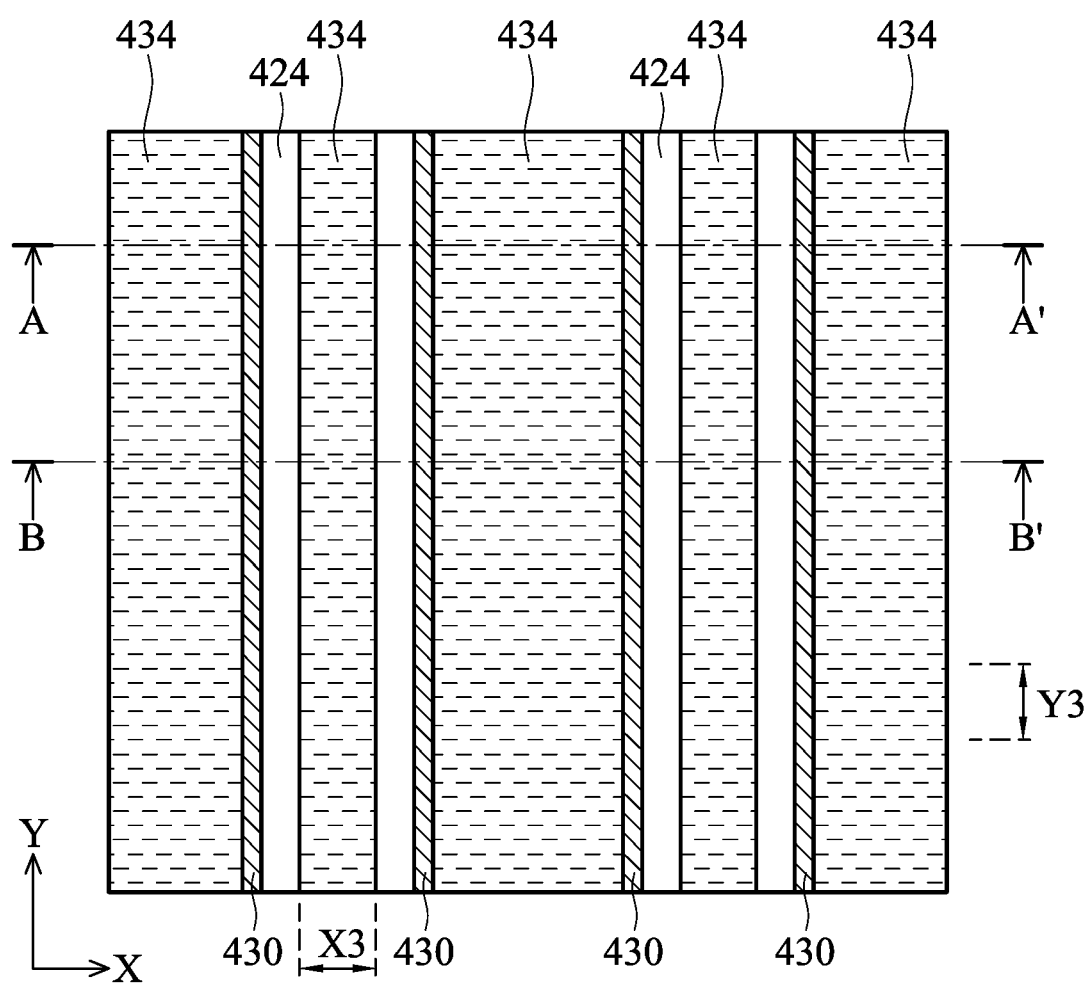
Figure 7B:
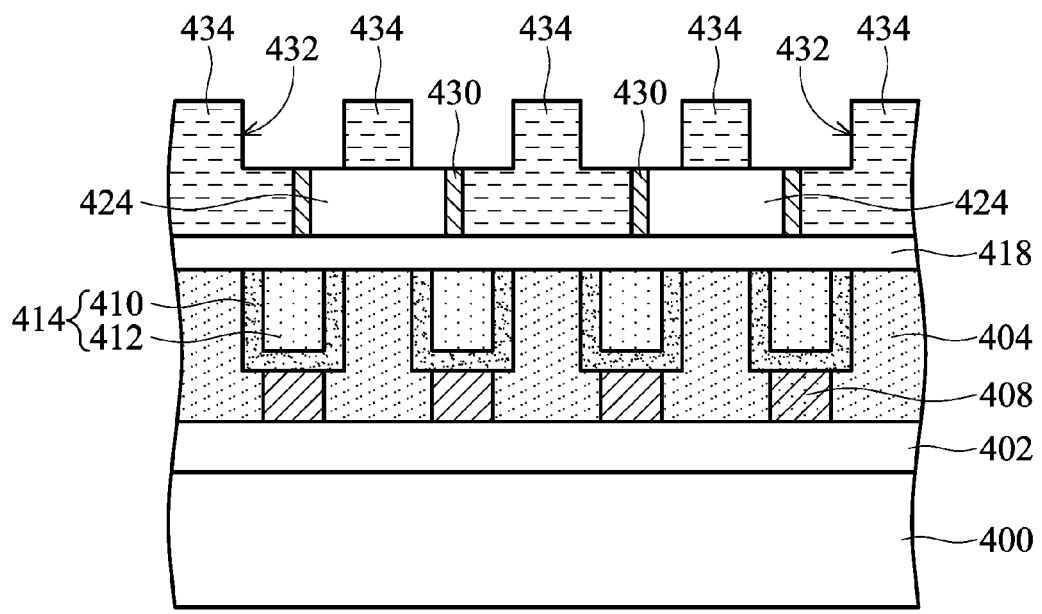
Figure 7C:
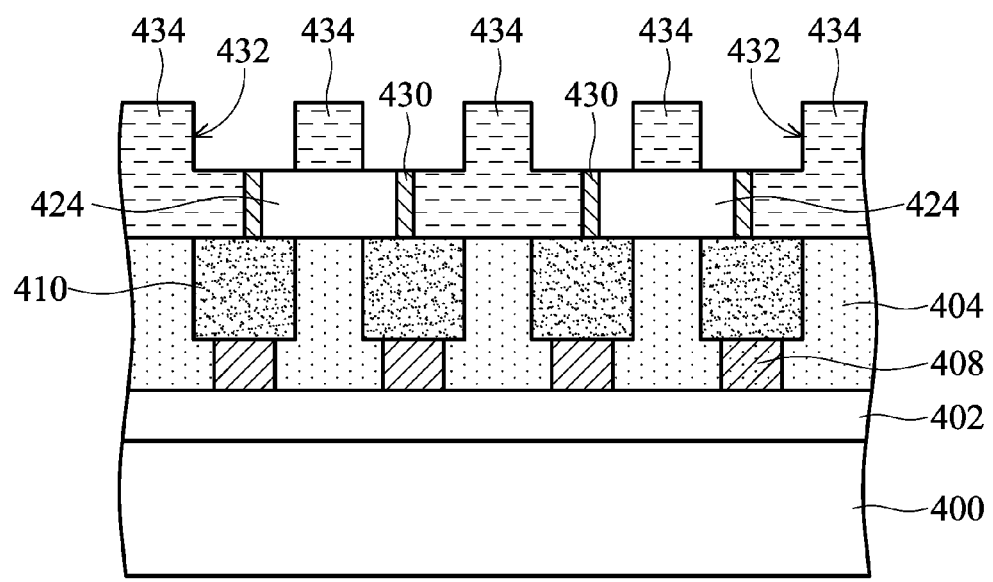

FIGS. 7a, 7b and 7c illustrate formation of trenches 432. A dielectric layer 434 is first spin coated to cover the structures illustrated in FIGS. 6a, 6b and 6c. The dielectric layer 434 may comprise material such as spin-on glass (SOG) or the like. Thus, the dielectric layer 434 is formed with a planar surface. Next, a photolithography and etching process are performed to define the dielectric layer 434 and form a plurality of parallel trenches in the dielectric layer 432, each extending along a Y direction as shown in FIG. 7a. Herein, each of the trenches 432 substantially stacks over one of the cup-shaped heating electrodes 414 and is vertically aligned therewith, thereby exposing the phase change material layer 430, the insulating layer 424 and the dielectric layer 434 adjacent thereto.

Figure 8A:
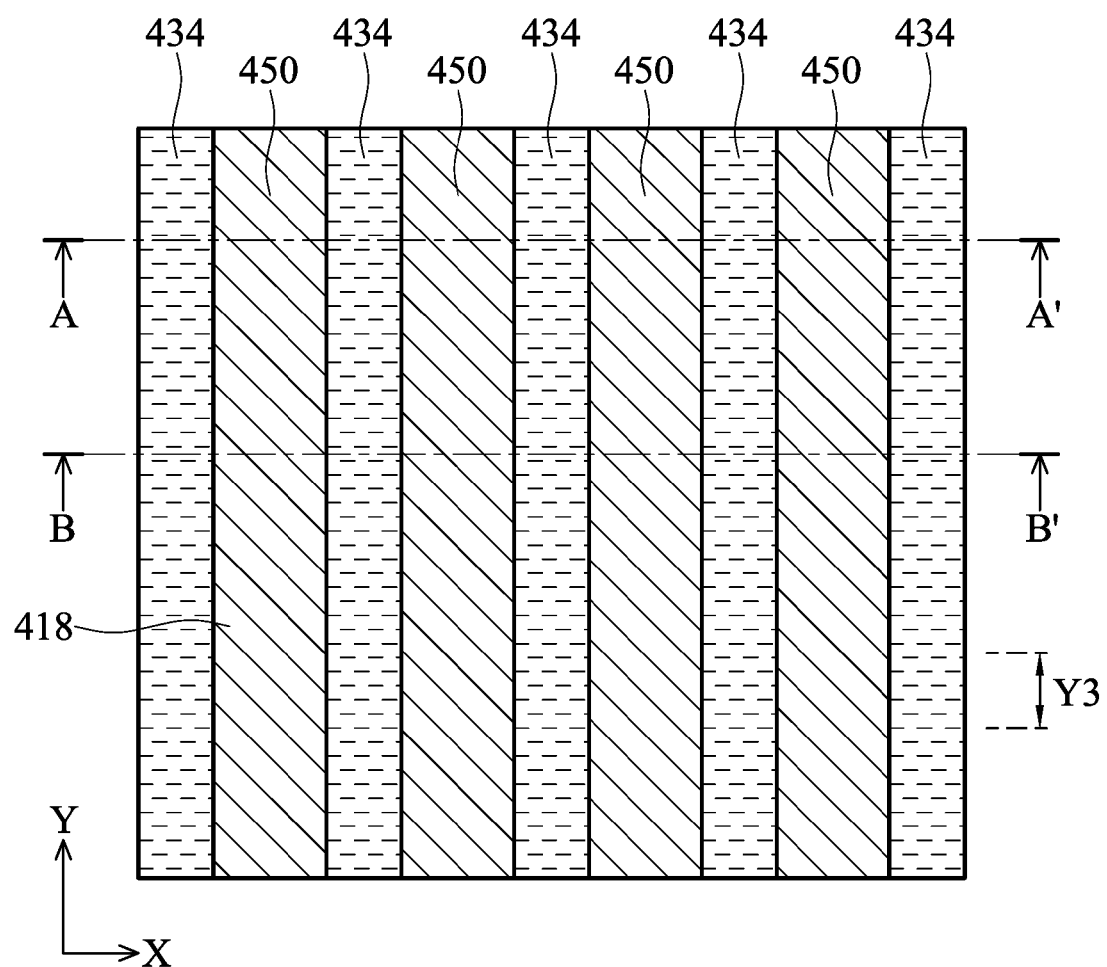
Figure 8B:
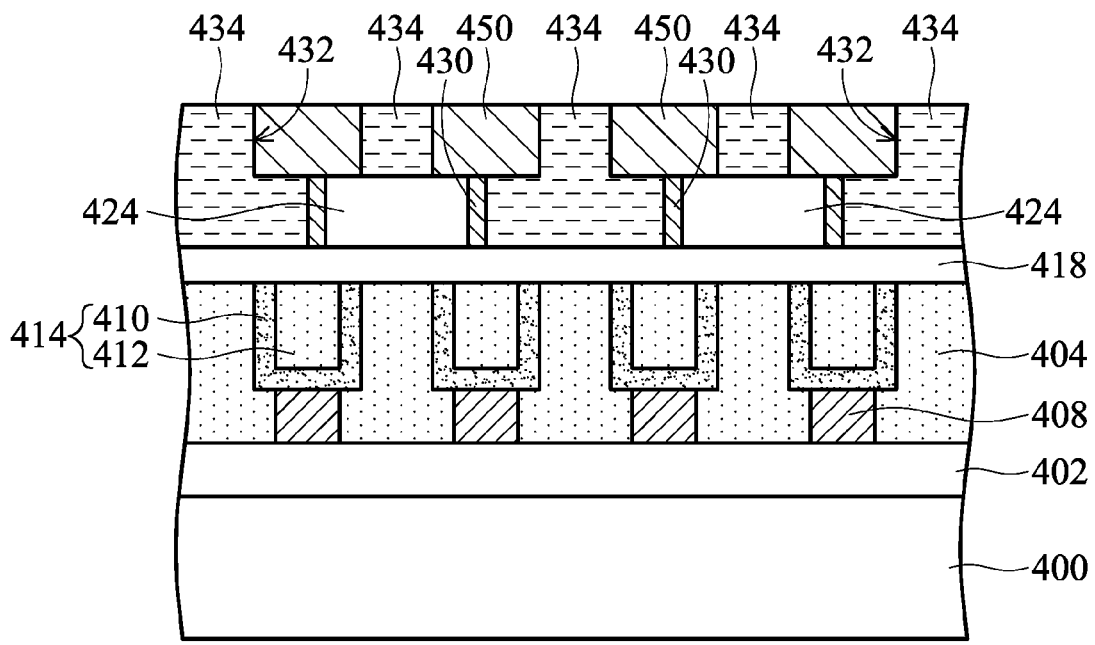
Figure 8C:
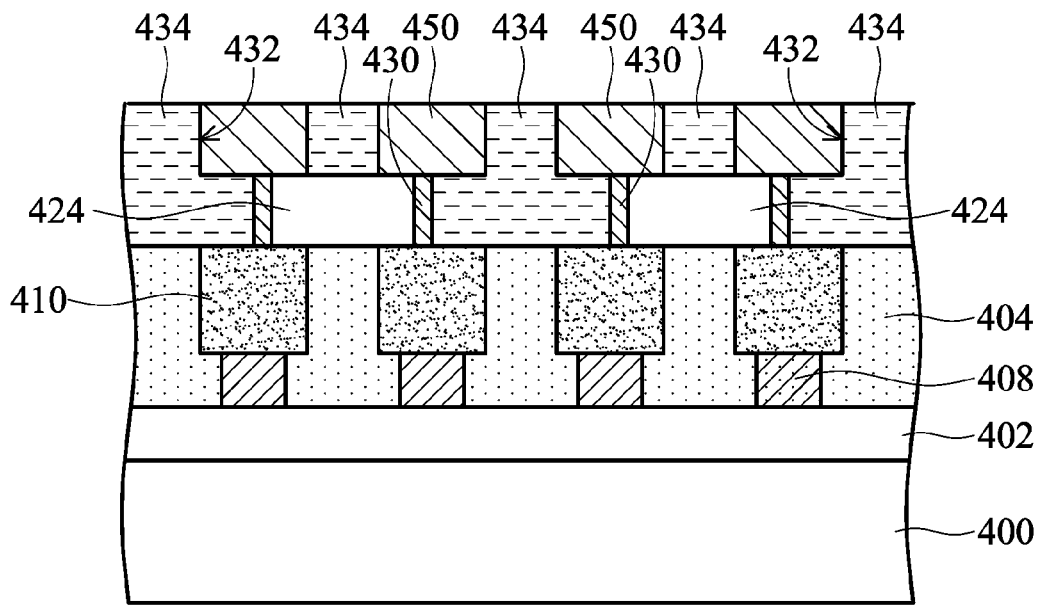

FIGS. 8a, 8b, and 8c illustrate formation of conductive layers 450. A conductive material such as Al, CU/TaN or other metal materials are first blanketly deposited to cover the structures illustrated in FIGS. 7a-7c and fill the trenches 432. Next, a planarizing process such as a chemical mechanical polishing process is performed to remove the portion of the conductive material above the surface of the dielectric layer 434, thereby forming a conductive layer 450 in each of the trenches 432 and complete fabrication of the phase change memory device. Herein, each of the conductive layers 450 function as a top electrode and fabrication of the conductive layers 450 and the trenches 432 can be achieved by, for example, a damascene process.

In this embodiment, since the top electrode is stacked over the cup-shaped heating electrode 414 and substantially vertically aligned therewith, the top electrode will not protrude over a surface of the cup-shaped heating electrode 414. Thus, pitches X3 and Y3 designed for the cup-shaped heating electrodes 414 can be further reduced when compared with the pitches X1, X2, Y1, Y2 and combinations thereof illustrated in FIGS. 2a~2d, thereby increasing memory cell density of a PCM device. In this embodiment, a pitch X3 or Y3 between the adjacent cup-shaped heating electrodes 414 will not be greater than the aperture of the cup-shaped heating electrode 414.

The exemplary phase change memory device illustrated in FIGS. 8a, 8b and 8c, mainly comprise a substrate 400 with a first electrode 402 formed thereover. A first dielectric layer 404 is formed over the first electrode and the substrate. A plurality of cup-shaped heating electrodes 414 is respectively disposed in a portion of the first dielectric layer. A first insulating layer 418 is formed over the first dielectric layer along a first direction, partially covering the cup-shaped heating electrodes and the first dielectric layer therebetween. A second insulating layer 424 is formed over the first dielectric layer along a second direction, partially covering the cup-shaped heating electrodes and the first dielectric layer therebetween. A pair of phase change material layers 430 is respectively foed on opposing sidewalls of the second insulating layer and contacting with one of the cup-shaped heating electrodes. A pair of first conductive layers 450 is formed on the second insulating layer along the second direction, respectively, wherein one of the first conductive layers contact with one of the phase change material layers.

Some advantages of the exemplary embodiment of the phase change memory device are described in the following. Cell density can be increased, as the phase change memory device can be formed with further reduced cell pitch of a unit memory cell. Contact area can be further reduced, as the contact area between the phase change material layer and the conductive layer can be controlled via controlling an intersecting area of the phase change material spacer and the cup-shaped heating electrode. Due to the reduced contact area, working currents such as write currents and reset currents can be further reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory (PCM) device, comprising:
   a substrate;
   a first electrode formed over the substrate;
   a first dielectric layer formed over the first electrode and the substrate;
   a plurality of cup-shaped heating electrodes, respectively disposed in a portion of the first dielectric layer;
   a first insulating layer formed over the first dielectric layer along a first direction, partially covering the cup-shaped heating electrodes and the first dielectric layer therebetween;

a second insulating layer formed over the first dielectric layer along a second direction, partially covering the cup-shaped heating electrodes and the first dielectric layer therebetween;

a pair of phase change material layers respectively disposed on opposing sidewalls of the second insulating layer, wherein each of the pair of phase change material layers physically contact with one of the cup-shaped heating electrodes thereunder; and a pair of first conductive layers formed on the second insulating layer along the second direction, respectively, wherein one of the first conductive layers contact with one of the phase change material layers.

2. The PCM device as claimed in claim 1, wherein each of the cup-shaped heating electrodes comprising:

a second conductive layer disposed over the first electrode, wherein the second conductive layer is cup-shaped and comprises an opening; and a third insulating layer filled in the opening.

3. The PCM device as claimed in claim 2, wherein the second conductive layer comprises metals, alloys, metal compounds, semiconductor materials or combinations thereof.

4. The PCM device as claimed in claim 1, wherein the first insulating layer respectively covers half of the top surfaces of the cup-shaped heating electrodes.

5. The PCM device as claimed in claim 1, wherein the second insulating layer respectively covers half of the top surfaces of the cup-shaped heating electrodes.

6. The PCM device as claimed in claim 1, wherein the first conductive layers are respectively formed on one of the cup-shaped heating electrodes and are aligned therewith, respectively.

7. The PCM device as claimed in claim 1, wherein a pitch between the cup-shaped heating electrodes is not greater than an aperture of the cup-shaped heating electrodes.

8. The PCM device as claimed in claim 1, wherein the first direction is perpendicular to the second direction.

* * * * *